(12) United States Patent
Kim et al.

(10) Patent No.: US 8,710,520 B2
(45) Date of Patent: Apr. 29, 2014

(54) LIGHT EMITTING DIODE HAVING MULTI-CELL STRUCTURE AND METHOD OF MANUFACTURING THE SAME

(75) Inventors: Sang-Mook Kim, Gwangju Gwangyeok-Si (KR); Jong-Hyeob Baek, Daejeon Gwangyeok-Si (KR); Kwang-Cheol Lee, Gwangju Gwangyeok-Si (KR); Eun-Mi Yoo, Gwangju Gwangyeok-Si (KR)

(73) Assignee: Korea Photonics Technology Institute, Gwangu (KR)

( * ) Notice: Subject to any disclaimer, the term of this patent is extended or adjusted under 35 U.S.C. 154(b) by 0 days.

(21) Appl. No.: 13/504,522

(22) PCT Filed: Nov. 2, 2010

(86) PCT No.: PCT/KR2010/007668
§ 371 (c)(1),
(2), (4) Date: Apr. 27, 2012

(87) PCT Pub. No.: WO2012/023662
PCT Pub. Date: Feb. 23, 2012

(65) Prior Publication Data
US 2013/0134462 A1    May 30, 2013

(30) Foreign Application Priority Data
Aug. 16, 2010   (KR) .................. 10-2010-0078771

(51) Int. Cl.
*H01L 33/36* (2010.01)

(52) U.S. Cl.
USPC .......... 257/89; 257/91; 257/98; 257/E33.062; 438/34; 438/35; 438/609; 438/666

(58) Field of Classification Search
USPC ............ 257/89, 91, 98, E33.062; 438/34, 35, 438/609, 666
See application file for complete search history.

(56) References Cited

U.S. PATENT DOCUMENTS

| | | | | |
|---|---|---|---|---|
| 6,144,043 | A * | 11/2000 | Ogihara et al. | 257/88 |
| 6,844,957 | B2 * | 1/2005 | Matsumoto et al. | 359/296 |
| 6,936,502 | B2 * | 8/2005 | Wyrzykowska et al. | 438/125 |
| 7,179,670 | B2 * | 2/2007 | Shelton et al. | 438/26 |
| 7,652,304 | B2 * | 1/2010 | Steigerwald et al. | 257/99 |
| 8,329,482 | B2 * | 12/2012 | Yao et al. | 438/28 |
| 8,471,280 | B2 * | 6/2013 | Aldaz et al. | 257/98 |
| 8,476,668 | B2 * | 7/2013 | Ibbetson et al. | 257/99 |
| 8,546,189 | B2 * | 10/2013 | Camacho et al. | 438/118 |
| 8,557,677 | B2 * | 10/2013 | Liang et al. | 438/455 |
| 8,558,246 | B2 * | 10/2013 | Kim et al. | 257/81 |
| 8,574,936 | B2 * | 11/2013 | Horng et al. | 438/27 |
| 8,598,591 | B2 * | 12/2013 | Umezaki | 257/72 |
| 8,598,609 | B2 * | 12/2013 | Ibbetson et al. | 257/98 |

* cited by examiner

*Primary Examiner* — George Fourson, III

(57) ABSTRACT

Disclosed is a light emitting diode having a multi-cell structure including a number of unit cells. The light emitting diode is capable of reducing light loss of the light emitting diode surface and improving light efficiency by bonding pads to be formed for contact between mesa etching regions for forming an electrode of the existing n-type semiconductor layers and p-type semiconductor layers. The light emitting diode is also capable of controlling chip size and manufacturing chips of different sizes from each other even when going through the same chip manufacturing process as the related art.

20 Claims, 4 Drawing Sheets

LIGHT EMITTING DIODE HAVING MULTI-CELL STRUCTURE AND METHOD OF MANUFACTURING THE SAME

CROSS-REFERENCE TO RELATED APPLICATIONS

This application is a 371 of International Application No. PCT/KR2010/007668, filed 2 Nov. 2010, which claims priority to Korean Patent Application No. 10-2010-0078771, filed 16 Aug. 2010, which applications are hereby incorporated herein by reference in their entireties and from which applications priority is hereby claimed under 35 U.S.C. §119 (e) and §120.

FIELD

The present invention relates to a light emitting diode having a multi-cell structure including a number of unit cells, and more particularly, to a light emitting diode capable of reducing light loss of the light emitting diode surface and improving light efficiency by bonding pads to be formed for contact between mesa etching regions for forming an electrode of the existing n-type semiconductor layers and p-type semiconductor layers. Further, the present invention relates to a light emitting diode capable of controlling chip size and manufacturing chips of different sizes from each other even when going through the same chip manufacturing process as the related art.

BACKGROUND

Recently, lighting units etc. formed with a light emitting diode (LED) have long lifetime and consume low power as a with existing incandescent lights or fluorescent lights, and demand thereof is significantly increasing due to the advantage of not releasing pollutants in the manufacturing process. In addition, LEDs are being applied to backlight devices of lighting apparatuses or LCD displays as well as display devices requiring light emitting, such that application areas thereof are widening. Particularly, LEDs have low heat and long life due to high energy efficiency while being driven with relatively low voltage, and as technologies capable of providing white light with high-brightness that was difficult to implement in the related art are developed, it is expected that most light source devices being currently used may be replaced with LEDs.

The LED is sold-state device converting electrical energy into light, and generally includes an active layer of semiconductor material interposed between two facing doped layers. When applying bias to both ends of two doped layers, and after holes and electrons are injected into the active layer, holes and electrons are recombined at the active layer to generate the light. Then, the light generated from the active layer is emitted in all directions, and is emitted outside a semiconductor chip through all exposed surfaces.

A typical structure of nitride semiconductor light emitting diode includes a buffer layer, an n-type nitride semiconductor layer, an active layer of a multi quantum well structure and a p-type nitride semiconductor layer, and the p-type nitride semiconductor layer and the active layer are partially removed by etching etc., such that some of the top of the n-type nitride semiconductor layer is exposed. An n-type electrode is formed on the exposed n-type nitride semiconductor, a transparent electrode layer forming ohmic contact is formed on the p-type nitride semiconductor layer and then, a p-type bonding electrode is formed.

In the light emitting diode formed by a method of manufacturing the light emitting diode in the related art, to form the n-type electrode on the n-type nitride semiconductor layer, since the active layer should be partially removed, there is a problem that light output is weakened due to the loss of the active layer.

Further, there are problems that efficiency of the reflective film is lowered due to the metal pad formed to be relatively large as compared with the chip size.

Therefore, requirements for light emitting devices are as follows. Firstly, the loss of the active layer due to mesa etching etc. forming an n-type electrode is not generated; secondly, when forming the n-type electrode, the loss of the active layer is minimized, thereby to control the size and position of a p-type electrode, such that the brightness may be improved; thirdly, a chip size has flexibility by forming one chip bound with a number of unit cells; and fourthly, although the light emitting diode is formed by binding a number of the unit cells, the light output is improved by filling a reflective layer or current diffusion layer between the unit cells.

SUMMARY

Therefore, the present embodiment(s) describe methods and systems to solve the above problems in the related art, and to provide a light emitting diode having a package structure of a wafer in which the chip size can be controlled, and wire bonding is not needed by adding protection films and metal pads to form a multi cell structure, by obtaining the multi cell structure connected in the form of a number of unit cells.

In various embodiments, a light emitting diode is provided capable of improving brightness and electrical and thermal characteristics of the light emitting diode by minimizing the area for a contact portion of the first semiconductor layer and freely performing contact with the second semiconductor layer at a manufacturing level of the light emitting diode device, by adapting the structure minimizing the portion generating the loss of the active layer to improve the current diffusion when manufacturing the light emitting diode.

In other embodiments, a light emitting diode is provided without additionally forming a bonding pad to be formed to a mesa etched surface by forming an n-type pad and a p-type pad for mounting the package on the same surface.

The technical problems are not limited to the above-described problems, and other technical problems that are not mentioned above will be clearly understood by those skilled in the art from the following description.

In order to accomplish the above purpose, there is provided a light emitting diode having a multi-cell structure including unit cells, comprising: a translucent substrate; a first semiconductor layer, an active layer and a second semiconductor layer sequentially formed on the translucent substrate; a plurality of holes formed to be spaced apart from each other by partially removing the region of the second semiconductor layer and the active layer; a first electrode being in contact with the first semiconductor layer through some holes of the plurality of holes, and formed so that the top surface thereof is exposed outside; a first protection film wrapping a side circumference of the first electrode to prevent a short between the first semiconductor and the second semiconductor; a second protection film formed on sides and bottom surfaces of holes, not having the first electrode, of the plurality of holes; a reflective layer or a current diffusion layer formed on the second protection film and the second semiconductor layer; and a second electrode formed on the reflective layer or the current diffusion layer.

The unit cells can be plurally formed wherein a number of the unit cells are connected by the first electrode and the second electrode to be formed in a metal line type.

The light emitting diode can further comprise: a third protection film which is formed to be in contact with the side of the second electrode, and covers the top of the first electrode and a metal line to prevent the short between the first electrode and the second electrode; a first metal pad being in contact with the first electrode through the holes removed with the predetermined region of the second protection film; and a second metal pad being in contact with the second electrode and formed to be spaced apart from the first metal pad.

The light emitting diode can further comprise a fourth protection film which is formed on the region not formed with the first metal pad and the second metal pad on the third protection film to prevent the short between the first metal pad and second metal pad.

The first protection film, the second protection film, the third protection film or the fourth protection film can be formed by any one material selected from a group consisting of $SiO_2$, $Si_3N_4$, resin or spin on glass (SOG).

The reflective layer can be formed by at least one material selected from a group consisting of silver (Ag), nickel (Ni), aluminum (Al), titanium (Ti), palladium (Pd), platinum (Pt), ruthenium (Ru), gold (Au), rhodium (Rh), iridium (Ir), indium tin oxide (ITO), indium zinc oxide (IZO), indium oxide, tin oxide, silicon oxide ($SiO_2$), silicon nitride ($Si_3N_4$), aluminum oxide and titanium oxide.

The current diffusion layer can be formed by any one material selected from a group consisting of indium tin oxide (ITO), zinc oxide (ZnO) and Ni/Au.

In accordance with another aspect of the present embodiments, there is provided a method of fabricating a light emitting diode having a multi-cell structure, comprising: sequentially forming a first semiconductor layer, an active layer and a second semiconductor layer on a translucent substrate; forming a plurality of holes by removing the second semiconductor layer and active layer so that a top surface of the first semiconductor layer is exposed after patterning and etching for each region to be spaced at a predetermined interval on the second semiconductor layer; forming a first protection film on the side of some holes of the plurality of holes; forming a first electrode being in contact with the first semiconductor layer through holes formed with the first protection film, and formed so that the top surface thereof is exposed outside; forming a second protection film formed on sides and bottom surfaces of holes, not having the first electrode, of the plurality of holes; forming a reflective layer or a current diffusion layer in the holes formed with the second protection film and on the second semiconductor layer; and forming a second electrode formed on the reflective layer or the current diffusion layer and being in contact with the second semiconductor layer.

The method further comprises connecting each of the unit cells to each other by forming the first electrode and the second electrode in the metal line type, respectively, after forming of the second electrode.

The method further comprises: forming a third protection film covering the top of the first electrode and metal line, and interfacing with the side of the second electrode; forming a plurality of the holes to be spaced apart from each other by partially removing the third protection film; forming a first metal pad being in contact with the first electrode through the holes; and forming a second metal pad being in contact with the second electrode and to be spaced apart from the first metal pad, after forming of the metal line.

The method further comprises forming a fourth protection film on the third protection film not formed with the first metal pad and the second metal pad, after forming of the second metal pad.

According to the light emitting diode having the multi-cell structure of the present embodiment(s), chips of each unit cells structure may be configured as one light emitting diode multi-cell through the protection film process and the metal line process connecting the unit cells, thereby to have flexibility in chip size and to increase the productivity and reduce the manufacturing costs. In addition, the light extraction efficiency may be improved by forming reflective metal or a transparent electrode at intervals between a number of the unit cells, and the shape of the light emitting diode may have flexibility by randomly determining the size and position of the second electrode being in contact with the second semiconductor layer.

In the present embodiment(s), chips of each unit cells structure may be configured by one light emitting diode multi-cell through a protection film process and metal line process connecting the unit cells, thereby to have flexibility in chip size and to increase the productivity and reduce the manufacturing costs. In addition, light extraction efficiency may be improved by forming a reflective metal or transparent electrode etc. at intervals between a number of the unit cells, and the shape of the light emitting diode may have flexibility by randomly determining the size and position of the second electrode being in contact with the second semiconductor layer.

In addition, the light emitting diode having the chip size different from each other may be implemented by the difference in cutting process in the same wafer, thereby to increase the productivity and reduce the manufacturing costs.

Further, according to the present embodiment(s), the etching portion contacting an n-type semiconductor (the first semiconductor layer) when manufacturing the light emitting diode is reduced as compared with the related art, thereby to minimize the loss region of the active layer and to widen an effective light emitting area, such that the light output is improved. In addition, in the case of a large-area chip, the number of the required pads is reduced, and light absorption by the pads is prevented, such that the light output of the light emitting diode package is improved Further, according to the present embodiment(s), since the n-type pad (the first metal pad) and the p-type pad (the second metal pad) are formed on the same side, it is not necessary to additionally form the bonding pad in the n-type pad to be formed in mesa etched side, thereby to simplify the manufacturing process and to reduce the manufacturing cost.

Further, according to the present embodiment(s), since there is no direct contact between the reflective layer and the bonding metal, damage of the reflective layer made by the metal etc. is prevented.

BRIEF DESCRIPTION OF THE DRAWINGS

The above and other features of the present invention will be more clearly understood from the following detailed description taken in conjunction with the accompanying drawings, in which.

DETAILED DESCRIPTION

Hereinafter, various exemplary embodiments of the present invention will be described with reference to the accompanying drawings.

Prior to this, terms or words used in the specification and claims should not be construed as limited to a lexical meaning, and should be understood as appropriate notions by the inventor based on that he/she is able to define terms to describe his/her invention in the best way to be seen by others. Therefore, embodiments and drawings described herein are simply exemplary and not exhaustive, and it will be understood that various modifications and equivalents may be made to take the place of the embodiments.

Figure 1A:
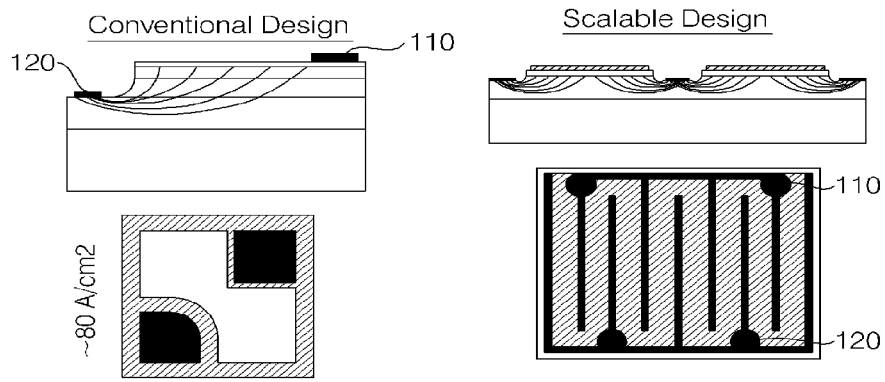
FIG. 1a is a view illustrating an example of an electrode structure of a light emitting diode in the related art.

FIG. 1a is a view illustrating an example of an electrode structure of a light emitting diode in the related art.

Referring to FIG. 1, a typical structure of the light emitting diode include an n-type nitride semiconductor layer, an active layer and a p-type nitride semiconductor layer sequentially formed on the substrate, and the p-type nitride semiconductor layer and the active layer are partially removed by etching etc., such that some of the top of the n-type nitride semiconductor layer is exposed. An n-type electrode or a first electrode 120 is formed on the exposed n-type nitride semiconductor layer. To form ohmic contact, a transparent electrode layer is formed on the p-type nitride semiconductor layer, and then a p-type electrode or a second electrode 110 is formed.

The light emitting diode in the related art should partially remove the active layer to form the n-type electrode or the first electrode 120 on the n-type nitride semiconductor layer. Therefore, there are problems weakening the light output and limiting current diffusion in the horizontal direction, due to loss of the active layer.

In the related art, particularly in the electrode structure for the light emitting diode of horizontal structure, the electrode structure of a finger type has been developed to overcome the problem limiting the current diffusion in the horizontal direction. The electrode structure of the finger type has an advantage in terms of the current diffusion, but the mesa etching etc. should be essentially performed to contact an n-type semiconductor layer and n-type electrode or the first electrode 120, thereby to cause the loss of the active layer generating the light, such that it is difficult to manufacture a high-output light emitting diode.

Figure 1B:
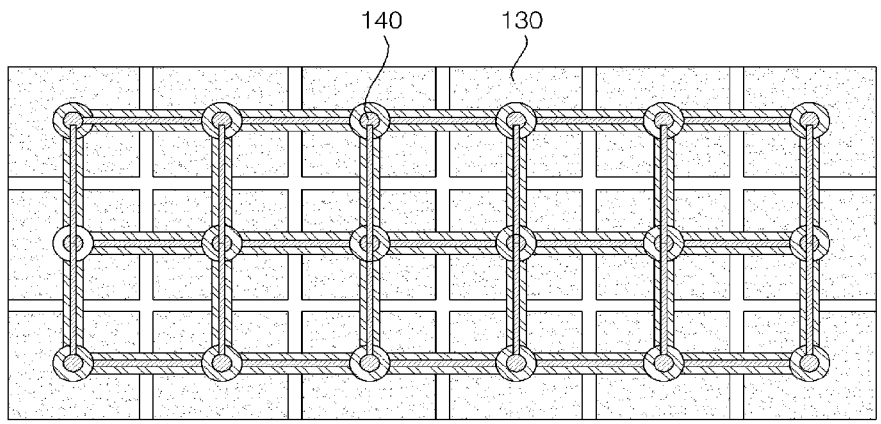
FIGS. 1b and 1c are top views of a light emitting diode having a multi-cell structure according to an exemplary embodiment.
Figure 1C:
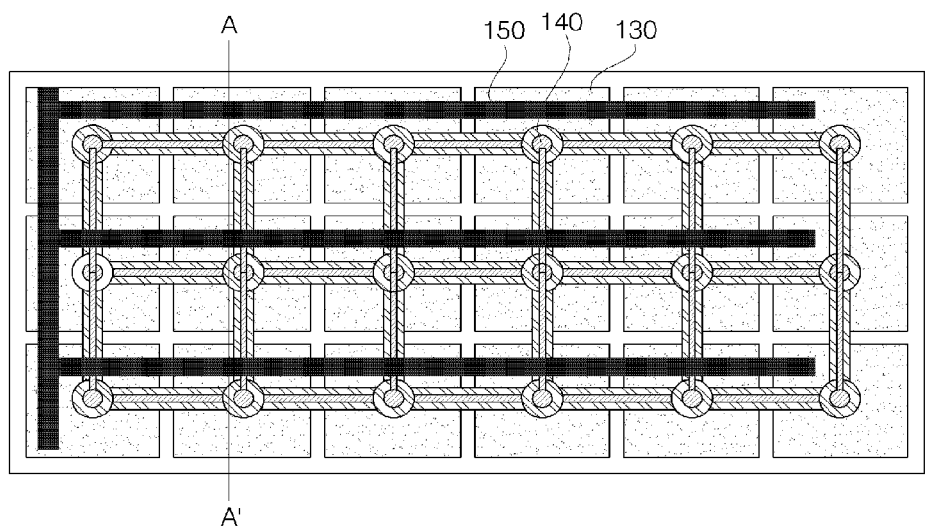

FIGS. 1b and 1c are top views of a light emitting diode having a multi-cell structure according to an embodiment of the present invention.

In the light emitting diode having a multi-cell structure of the present, unit cells include a translucent substrate; a first semiconductor layer, an active layer and a second semiconductor layer sequentially formed on the translucent substrate; a plurality of holes formed to be spaced apart from each other by partially removing the second semiconductor layer and the active layer; a first electrode being in contact with the first semiconductor layer through some holes of the plurality of holes, and formed so that the top surface thereof is exposed outside; a first protection film wrapping a side circumference of the first electrode to prevent a short between the first semiconductor and the second semiconductor; a second protection film formed on a side and bottom surface of holes, not having the first electrode, of the plurality of holes; a reflective layer or a current diffusion layer formed on the second protection film and the second semiconductor layer; and a second electrode formed on the reflective layer or the current diffusion layer.

Here, the light emitting diode of the present invention includes the plurality of unit cells 130 wherein it is preferable that the plurality of unit cells are connected by a metal line of the first electrode 140 and a metal line of the second electrode 150 in a metal line type. In the first electrode of the present embodiment(s), a top surface thereof may be in the form of a circle, quadrangle or polygon, and the cross section of the side thereof may be in the form of a rectangle.

In the present embodiment(s), it is preferable that the first semiconductor layer is an n-type nitride semiconductor layer, and the second semiconductor layer is a p-type nitride semiconductor layer, but is not limited thereto and also possible vice versa.

Hereinafter, a structure and a manufacturing procedure of the light emitting diode will be described with reference to FIGS. 2a to 2g according to the embodiment of the present embodiment(s).

FIGS. 2a to 2g are cross sectional views illustrating steps of manufacturing the light emitting diode having the multi-cell structure according to the embodiment of the present embodiment(s).

FIGS. 2a to 2g are views illustrating the manufacturing procedure based on the section taken on line A-A' of the light emitting diode device of FIG. 1c.

Figure 2A:
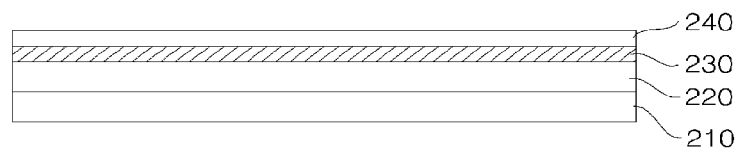
FIGS. 2a to 2g are cross sectional views illustrating the procedure of manufacturing the light emitting diode having the multi-cell structure according to an exemplary embodiment.

First, referring to FIG. 2a, the first semiconductor layer 220, the active layer 230 and the second semiconductor layer 240 are sequentially deposited on the translucent substrate 210.

The translucent substrate 210 may be a sapphire substrate etc., and further includes a buffer layer (not shown) between the translucent substrate 410 and the first semiconductor layer 220 to form the light emitting diode device. Further, the first semiconductor layer 220 may be the n-type nitride semiconductor layer, and the second semiconductor layer 240 may be the p-type nitride semiconductor layer.

When using a gallium nitride-base semiconductor layer, the gallium nitride-base semiconductor layer includes an n-type gallium nitride layer (n-GaN layer), an active layer formed by a multi quantum well structure to emit the light, and a p-type gallium nitride layer (p-GaN layer) on the translucent substrate.

Further, after forming the buffer layer on the translucent substrate if necessary, the n-GaN layer may be formed. Such a buffer layer reducing the difference in the lattice constant between the substrate and the semiconductor layer may be selected from a structure of AlInN, a superlattice structure of InGaN/GaN, a lamination structure of InGaN/GaN, and a lamination structure of AlInGaN/InGaN/GaN.

The first semiconductor layer 220 is formed on the translucent substrate or the buffer layer. In this case, the first semiconductor layer 220 may be formed by the n-GaN layer and doped by using silicon (Si) as a dopant. The doping is performed at high temperature, and ammonia (NH$_3$) is used as a carrier gas and a compound composed of Ga, N and Si may be used.

After forming the first semiconductor layer 220, the active layer 230 is formed. The active layer 230 may be a semiconductor layer adding a luminant material of InGaN. In addition, it is possible to use a material such as AlGaN, AlInGaN and the like as that of the active layer 230. At this moment, the active layer 230 may be formed by the quantum well (QW) structure of InGaN/GaN, the quantum well structure for improving brightness is plurally formed to form the multi quantum well (MQW) structure.

After forming the active layer 230, the second semiconductor layer 240 is formed on the active layer. The second semiconductor layer 240 may be formed by the p-GaN layer, and magnesium may be used as the dopant. It proceeds at the high temperature even in the present process, ammonia (NH$_3$) is used as the carrier gas and a compound composed of Ga, N and Mg may be used.

Figure 2B:
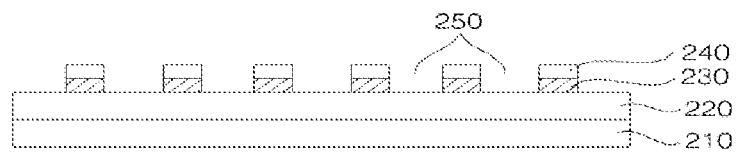

Referring to FIG. 2b, holes 250 formed to be spaced apart from each other are formed by partially removing the second semiconductor layer 240 and the active layer 230. The holes are formed so that the top surface of the first semiconductor layer 220 is exposed.

The holes 250 are formed to form the first electrode 270 and the reflective layer or the current diffusion layer 290, and the holes 250 are formed to be spaced at a predetermined interval on the second semiconductor layer 240 by the patterning process and etching process. At this moment, a wet etching method or a dry etching method is used.

Figure 2C:
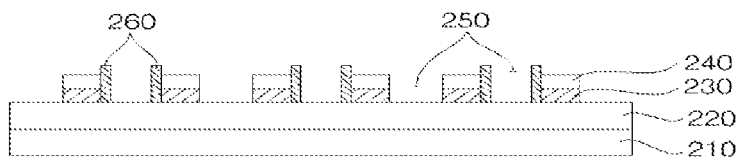

Referring to FIG. 2c, a first protection film 260 is formed on the side of some holes of the plurality of holes 250. It is preferable that the first protection film 260 is formed in even numbered holes or odd numbered holes only from the nearest side end.

The first protection film 260 is formed to prevent the short between the first electrode 270 and the second electrode 291. The first protection film 260 may be formed by any one material selected from a group consisting of SiO$_2$, Si$_3$N$_4$, resin or spin on glass (SOG).

Figure 2D:
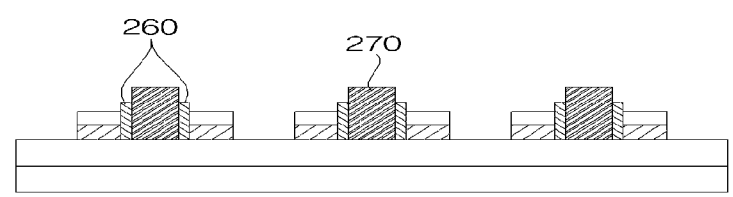

Referring to FIG. 2d, the first electrode 270 is formed on the region surrounded by the first protection film 260 and the first semiconductor layer 220. Since each of the first electrodes 270 are independent and are formed by divided structure, it is preferable that the first electrodes 270 are subsequently connected to metal lines. The first electrode 270 may be formed by using a known electrode material, and it is possible to form the first electrode 270 by doping the electrode paste.

Figure 2E:
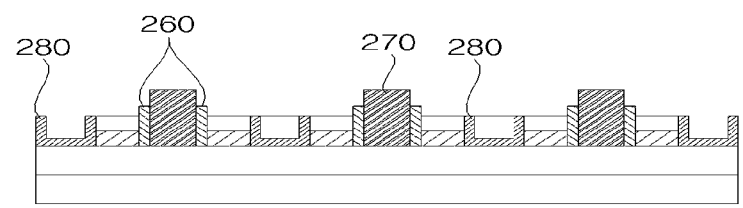

Referring to FIG. 2e, a second protection film 280 is formed on the holes, not having the first electrode 270, of the plurality of holes 250. The second protection film 280 is formed on the side and the bottom surface of the holes to perform insulation between the first semiconductor layer 220 and the reflective layer or the current diffusion layer 290.

Figure 2F:
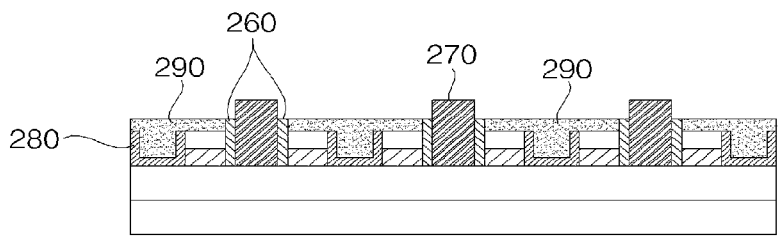
Figure 2G:
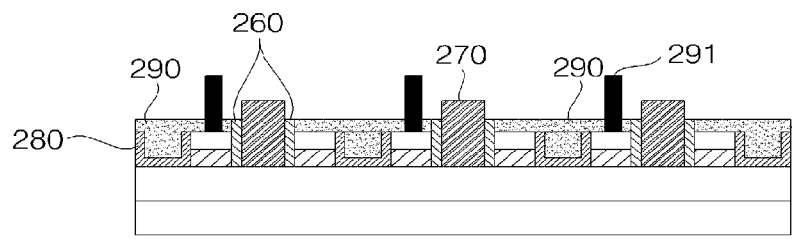

Referring to FIG. 2f, after forming the second protection film 280, the reflective layer or the current diffusion layer 290 is formed on the holes formed with the second protection film 280 and the second semiconductor layer 240. Shorting between the reflective layer or the current diffusion layer 290 and the first electrode 270 is prevented by the first protection film 260.

In the reflective layer or the current diffusion layer 290, the reflective layer may be formed by any one material selected from a group consisting of silver (Ag), nickel (Ni), aluminum (Al), titanium (Ti), palladium (Pd), platinum (Pt), ruthenium (Ru), gold (Au), rhodium (Rh), iridium (Ir), indium tin oxide (ITO), indium zinc oxide (IZO), indium oxide, tin oxide, silicon oxide (SiO$_2$), silicon nitride (Si$_3$N$_4$), aluminum oxide and titanium oxide if necessary. The reflective layer 290 is formed between the unit cells, such that light extraction efficiency may be further improved by suppressing light absorption from the inside of the light emitting diode.

Further, when forming the current diffusion layer, it is preferable to use metals such as Ni/Au or oxide film such as ITO, ZnO and the like.

Hereinafter, the metal line process may be performed to connect each of the independent first electrodes 270 to each other. Each of the unit cells are connected by the metal line process, and chip sizes may be controlled in a packaging process of a wafer structure.

Referring to FIG. 2h, the second electrode 291 is formed on the reflective layer 290.

The second electrode 291 is formed on the top surface of the second semiconductor layer 240, and the etching of the reflective layer 290 should be partially preceded. That is, the holes are formed so that the top surface of the second semiconductor layer 240 is exposed on the reflective layer 290 by the patterning process, wet etching or dry etching, such that the second electrode 291 is formed in the holes. At this moment, the material of the electrode may use a known material, and may be formed by doping the electrode paste.

In addition, the second electrode 291 may be formed by the finger type. Although the second electrode 291 is configured by the finger type, the first electrode 270 has an independent electrode structure, thereby to minimize the loss of the active layer and to improve the light output.

As a result, the first electrode 270 and the second electrode 291 are formed by the metal line type, such that a number of unit cells are connected to one package.

Further, the translucent substrate 210 or the first semiconductor layer 220 can form a concavo-convex structure (not shown) on the top surface thereof to further improve the light extraction effect. That is, the concavo-convex structure may be formed in interface between the translucent substrate 210 and the first semiconductor layer 220 or the interface between the first semiconductor layer 220 and the active layer 230.

The concavo-convex structure is formed using a photo-resist. When using the photo-resist as a pattern mask, the concavo-convex pattern may be formed by a method such as photo-lithography, e-beam lithography, ion-beam lithography, extreme ultraviolet lithography, proximity X-ray lithography or nano imprint lithography. Further, the process may use dry etching or wet etching.

Figure 3:
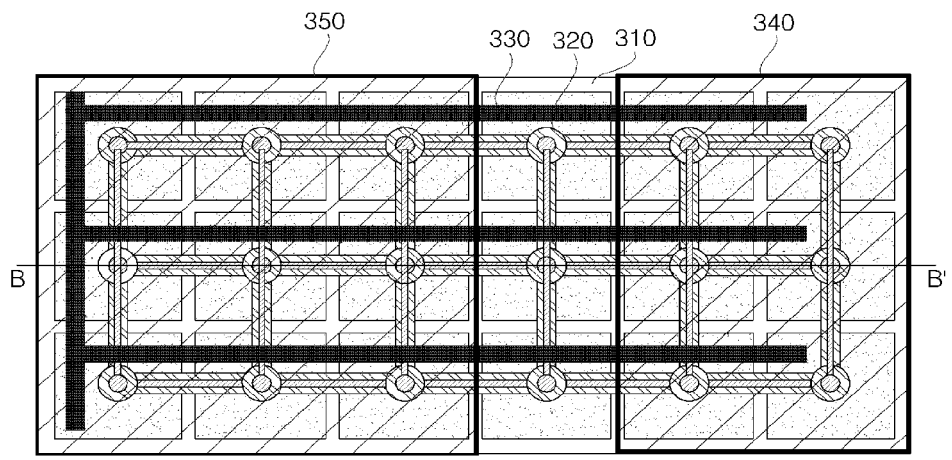
FIG. 3 is a top view of the light emitting diode having the multi-cell structure including a metal pad according to an exemplary embodiment.

FIG. 3 is a top view of the light emitting diode having the multi-cell structure including a metal pad according to an exemplary embodiment.

After forming the light emitting diode device having the multi-cell structure including unit cells 310, the metal pad is adhered to form the light emitting diode package. FIG. 3 is a top view of the light emitting diode device including the metal pad 340 and 350.

That is, the light emitting diode device having the multi-cell structures further includes a third protection film 292 covering the top of the first electrode 270 and metal lines 320, formed to be in contact with the side of the second electrode 291, and preventing the short between the first electrode 270 and the second electrode 291; a first metal pad 340 being in contact with the first electrode through the holes partially removed with the second protection film; and a second metal pad 350 being in contact with the second electrode and formed to be spaced apart from the first metal pad.

In addition, the light emitting diode of the present invention further includes a fourth protection film 293 formed on the region not formed with the first metal pad 340 and the second metal pad 350 on the third protection film 292. Hereinafter, the structure will be described in detail with reference to 4*a* to 4*c*.

Figure 4A:
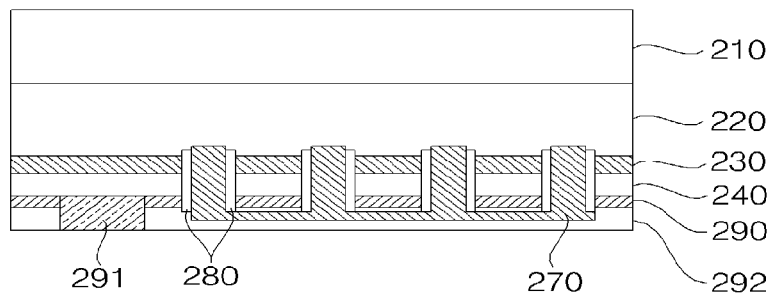
FIGS. 4a to 4c are cross sectional views illustrating the procedure of manufacturing the light emitting diode having the multi-cell structure including a metal pad according to an exemplary embodiment.
Figure 4B:
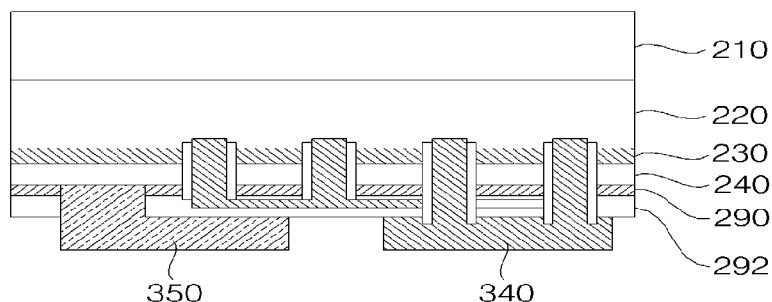
Figure 4C:
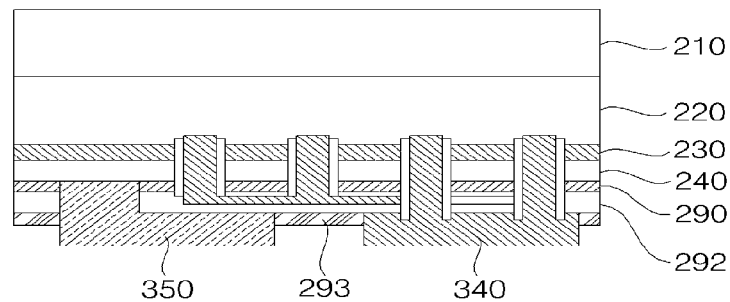

FIGS. 4*a* to 4*c* are cross sectional views illustrating the procedure of manufacturing the light emitting diode having the multi-cell structure including a metal pad according to an exemplary embodiment.

FIGS. 4*a* to 4*c* are sectional views taken on line B-B' for the top surface of the light emitting diode of FIG. 3.

First, referring to FIG. 4*a*, a third protection film 292 is formed on the reflective layer 290 to cover the first electrode 270 and the metal line. Further, the third protection film 292 may be formed to be interfaced with the side of the second electrode 291. The third protection film 292 is formed to prevent the short between the first electrode 270 and the second electrode 291, and may be formed by any one material selected from a group consisting of $SiO_2$, $Si_3N_4$, resin or spin on glass (SOG).

Therefore, since the first protection film 260, the second protection film 280 and the third protection film 292 are enough to have required insulation effects, the light emitting diode may be formed by the same material or a different material.

Referring to FIG. 4*b*, a first metal pad 340 being in contact with the predetermined first electrode 270 of the plurality of first electrode 270, and a second metal pad 350 being in contact with a second electrode 291 are formed. The size of the first metal pad 340 and second metal pad 350 may be controlled by considering the package process regardless of light emitting efficiency of the light emitting diode, thereby to form the light emitting diode device. As mentioned above, if the metal pad is formed, the metal pad may be applied to various applications by mounting in the substrate and forming the light emitting diode package.

Referring to FIG. 4*c*, a fourth protection film 293 is formed on the third protection film 292 in the region not formed with the first metal pad 340 and second metal pad 350. The fourth protection film 293 is formed so as to increase the stability of the device and ensure the insulation between the first metal pad 340 and second metal pad 350.

As mentioned above, when step forming the fourth protection film 293 is completed, the manufacturing process of the light emitting diode having the multi-cell structure proposed by the present description is completed, such that it is possible to manufacture the light emitting diode package of a wafer structure.

Figure 5:
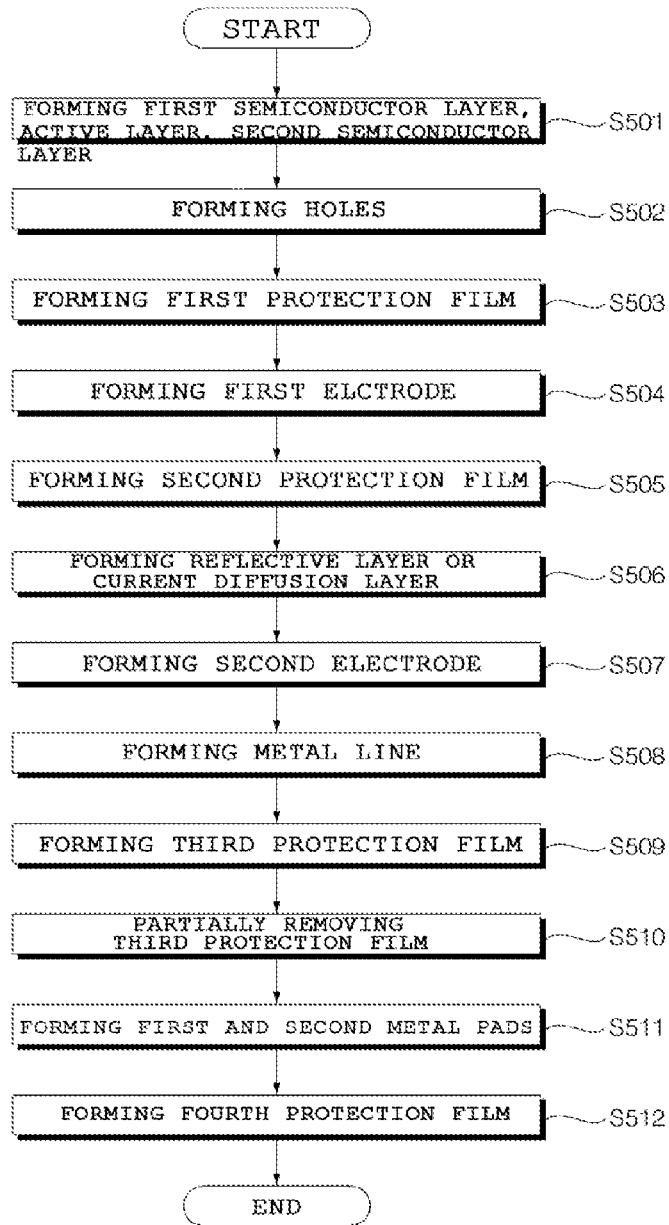
FIG. 5 is a flow chart for a method of manufacturing the light emitting diode having the multi-cell structure according to an exemplary embodiment.

FIG. 5 is a flow chart for the method of manufacturing the light emitting diode having the multi-cell structure according to an exemplary embodiment.

The first semiconductor layer, the active layer and the second semiconductor layer are sequentially formed on the translucent substrate such as sapphire substrate etc. in step S501, and a plurality of holes are formed by removing the second semiconductor layer and the active layer so that the top surface of the first semiconductor layer is exposed after patterning and etching for each region to be spaced at a predetermined interval on the second semiconductor layer in step S502. The holes are formed with a minimum size at a predetermined interval unlike the manufacturing process of the light emitting diode in the related art by partially removing the second semiconductor and the active layer, therefore the loss of the active layer is much smaller than that of a conventional light emitting diode device.

Then, the first protection film is formed on the side of some holes of the plurality of holes in step S503 to prevent the short between the electrodes.

After the above process, the first electrode, formed so that the top thereof is exposed outside, is formed by being in contact with the first semiconductor layer through the holes formed with the first protection film in step S504.

Subsequently, the second protection film is formed on the side and the bottom surface of the holes not formed with the first electrode in step S505. Therefore, the light extraction efficiency is further improved by forming the reflective layer or the current diffusion layer for each space between the unit cells.

Then, the reflective layer or the current diffusion layer is formed on the holes formed with the second protection film and the second semiconductor layer in step S506. The reflective layer may increase the light extraction efficiency by returning the light generating from the active layer to the translucent substrate. When forming the current diffusion layer, the current diffusion layer may further increase the light extraction efficiency by diffusing the current in the horizontal direction.

Subsequently, the second electrode for contacting the second semiconductor layer is formed on the reflective layer or the current diffusion layer in step S507. First, when etching the predetermined region of the reflective layer (or the current diffusion layer), the second electrode is formed on the region surrounded with the second semiconductor layer and the reflective layer (or the current diffusion layer). The second electrode, in which the top thereof has the finger type, may connect each of the unit cells to each other.

Thereafter, the metal line is formed to connect the plurality of first electrodes or the second electrode to each other in step S508, and therefore, the connection between each of the unit cells is completed. In succession, the process forming the light emitting diode package can be performed.

First, a third protection film, covering the top of the first electrode and the metal line and interfacing the side of the second electrode, is formed in step S509. It is possible to form the third protection film, preventing the short between the first electrode and the second electrode, as the same material as the first and second protection film or the material different from the first and second protection film.

Thereafter, to form the metal pad, at least two holes to be spaced apart from each other are formed by partially removing the third protection film in step S510, and are required for contact between the first metal pad and the first electrode.

After the holes are formed, a first metal pad being in contact with the first electrode is formed by doping and curing the electrode paste through the holes. After additionally forming the first protection film in the holes if necessary, it is also possible to form the first metal pad.

Thereafter, a second metal pad being in contact with the second electrode and to be spaced apart from the first metal pad is formed in step S511, and a fourth protection film is formed on the third protection film not formed with the first metal pad and the second metal pad in step S512, such that the light emitting diode device having the multi-cell structure forming the light emitting diode package is completed.

Even if the sizes of the first metal pad and the second metal pad become significantly large, it is fine. Therefore, the first metal pad and the second metal pad may be easily mounted in large packages as well as compact packages, thereby configuring the package. Further, since the first metal pad and the second metal pad to be mounted in the package are formed in the same side, it is not necessary to additionally form the bonding pad to be formed in a mesa etched side. Further, in the case of large-area chip, the number of the required pads is reduced, and the light absorption by the pad is prevented, such that the light output of the light emitting diode package is improved.

As mentioned above, according to the light emitting diode having the multi-cell structure of the present disclosure, chips of each unit cells structure may be configured as one light emitting diode multi-cell through the protection film process and the metal line process connecting the unit cells, thereby to have flexibility in chip size and to increase the productivity and reduce the manufacturing costs. In addition, the light extraction efficiency may be improved by forming reflective metal or a transparent electrode at intervals between a number of the unit cells, and the shape of the light emitting diode may have flexibility by randomly determining the size and position of the second electrode being in contact with the second semiconductor layer.

Although various embodiments have been described for illustrative purposes, those skilled in the art will appreciate that various alterations and modification are possible, without departing from the scope and spirit of the present invention as disclosed in the appended claims.

DESCRIPTION OF REFERENCE NUMERALS IN DRAWINGS 110, 291: Second electrode, 120, 270: First electrode
130, 310: Unit cell
140, 320: Metal line of the first electrode
150, 330: Metal line of the second electrode
210: Translucent substrate
220: First semiconductor layer, 230: Active layer
240: Second semiconductor layer, 250: Hole
260: First protection film, 280: Second protection film
290: Reflective layer or the current diffusion layer
292: Third protection film, 293: Fourth protection film
340: Metal pad, 350: Metal pad

What is claimed is:

1. A light emitting diode having a multi-cell structure including unit cells, comprising:
    a translucent substrate;
    a first semiconductor layer, an active layer and a second semiconductor layer sequentially formed on the translucent substrate;
    a plurality of holes formed to be spaced apart from each other by partially removing the region of the second semiconductor layer and the active layer;
    a first electrode being in contact with the first semiconductor layer through some holes of the plurality of holes, and formed so that the top surface thereof is exposed outside;
    a first protection film wrapping a side circumference of the first electrode to prevent a short between the first semiconductor and the second semiconductor;
    a second protection film formed on sides and bottom surfaces of holes, not having the first electrode, of the plurality of holes;
    a reflective layer or a current diffusion layer formed on the second protection film and the second semiconductor layer; and
    a second electrode formed on the reflective layer or the current diffusion layer.

2. The light emitting diode according to claim 1, wherein the unit cells are plurally formed wherein a number of the unit cells are connected by the first electrode and the second electrode to be formed in a metal line type.

3. The light emitting diode according to claim 2, further comprising:
    a third protection film which is formed to be in contact with the side of the second electrode, and covers the top of the first electrode and a metal line to prevent the short between the first electrode and the second electrode;
    a first metal pad being in contact with the first electrode through the holes removed with the predetermined region of the second protection film; and
    a second metal pad being in contact with the second electrode and formed to be spaced apart from the first metal pad.

4. The light emitting diode according to claim 3, further comprising a fourth protection film which is formed on the region not formed with the first metal pad and the second metal pad on the third protection film to prevent the short between the first metal pad and second metal pad.

5. The light emitting diode according to claim 1, wherein the first protection film, the second protection film, the third protection film or the fourth protection film is formed by any one material selected from a group consisting of $SiO_2$, $Si_3N_4$, resin or spin on glass (SOG).

6. The light emitting diode according to claim 1, wherein the reflective layer is formed by at least one material selected from a group consisting of silver (Ag), nickel (Ni), aluminum (Al), titanium (Ti), palladium (Pd), platinum (Pt), ruthenium (Ru), gold (Au), rhodium (Rh), iridium (Ir), indium tin oxide (ITO), indium zinc oxide (IZO), indium oxide, tin oxide, silicon oxide ($SiO_2$), silicon nitride ($Si_3N_4$), aluminum oxide and titanium oxide.

7. The light emitting diode according to claim 1, wherein the current diffusion layer is formed by any one material selected from a group consisting of indium tin oxide (ITO), zinc oxide (ZnO) and Ni/Au.

8. A method of fabricating a light emitting diode having a multi-cell structure, comprising:
    sequentially forming a first semiconductor layer, an active layer and a second semiconductor layer on a translucent substrate;
    forming a plurality of holes by removing the second semiconductor layer and active layer so that a top surface of the first semiconductor layer is exposed after patterning and etching for each region to be spaced at a predetermined interval on the second semiconductor layer;
    forming a first protection film on the side of some holes of the plurality of holes;
    forming a first electrode being in contact with the first semiconductor layer through holes formed with the first protection film, and formed so that the top surface thereof is exposed outside;
    forming a second protection film formed on sides and bottom surfaces of holes, not having the first electrode, of the plurality of holes;
    forming a reflective layer or a current diffusion layer in the holes formed with the second protection film and on the second semiconductor layer; and
    forming a second electrode formed on the reflective layer or the current diffusion layer and being in contact with the second semiconductor layer.

9. The method according to claim 8, further comprising connecting each of the unit cells to each other by forming the first electrode and the second electrode in the metal line type, respectively, after forming of the second electrode.

10. The method according to claim 9, further comprising:
    forming a third protection film covering the top of the first electrode and metal line, and interfacing with the side of the second electrode;

forming a plurality of the holes to be spaced apart from each other by partially removing the third protection film;

forming a first metal pad being in contact with the first electrode through the holes; and forming a second metal pad being in contact with the second electrode and to be spaced apart from the first metal pad, after forming of the metal line.

11. The method according to claim 10, further comprising forming a fourth protection film on the third protection film not formed with the first metal pad and the second metal pad, after forming of the second metal pad.

12. The light emitting diode according to claim 2, wherein the first protection film, the second protection film, the third protection film or the fourth protection film is formed by any one material selected from a group consisting of $SiO_2$, $Si_3N_4$, resin or spin on glass (SOG).

13. The light emitting diode according to claim 3, wherein the first protection film, the second protection film, the third protection film or the fourth protection film is formed by any one material selected from a group consisting of $SiO_2$, $Si_3N_4$, resin or spin on glass (SOG).

14. The light emitting diode according to claim 4, wherein the first protection film, the second protection film, the third protection film or the fourth protection film is formed by any one material selected from a group consisting of $SiO_2$, $Si_3N_4$, resin or spin on glass (SOG).

15. The light emitting diode according to claim 2, wherein the reflective layer is formed by at least one material selected from a group consisting of silver (Ag), nickel (Ni), aluminum (Al), titanium (Ti), palladium (Pd), platinum (Pt), ruthenium (Ru), gold (Au), rhodium (Rh), iridium (Ir), indium tin oxide (ITO), indium zinc oxide (IZO), indium oxide, tin oxide, silicon oxide ($SiO_2$), silicon nitride ($Si_3N_4$), aluminum oxide and titanium oxide.

16. The light emitting diode according to claim 3, wherein the reflective layer is formed by at least one material selected from a group consisting of silver (Ag), nickel (Ni), aluminum (Al), titanium (Ti), palladium (Pd), platinum (Pt), ruthenium (Ru), gold (Au), rhodium (Rh), iridium (Ir), indium tin oxide (ITO), indium zinc oxide (IZO), indium oxide, tin oxide, silicon oxide ($SiO_2$), silicon nitride ($Si_3N_4$), aluminum oxide and titanium oxide.

17. The light emitting diode according to claim 4, wherein the reflective layer is formed by at least one material selected from a group consisting of silver (Ag), nickel (Ni), aluminum (Al), titanium (Ti), palladium (Pd), platinum (Pt), ruthenium (Ru), gold (Au), rhodium (Rh), iridium (Ir), indium tin oxide (ITO), indium zinc oxide (IZO), indium oxide, tin oxide, silicon oxide ($SiO_2$), silicon nitride ($Si_3N_4$), aluminum oxide and titanium oxide.

18. The light emitting diode according to claim 2, wherein the current diffusion layer is formed by any one material selected from a group consisting of indium tin oxide (ITO), zinc oxide (ZnO) and Ni/Au.

19. The light emitting diode according to claim 3, wherein the current diffusion layer is formed by any one material selected from a group consisting of indium tin oxide (ITO), zinc oxide (ZnO) and Ni/Au.

20. The light emitting diode according to claim 4, wherein the current diffusion layer is formed by any one material selected from a group consisting of indium tin oxide (ITO), zinc oxide (ZnO) and Ni/Au.

* * * * *